US010361065B2

(12) United States Patent
Asai et al.

(10) Patent No.: US 10,361,065 B2
(45) Date of Patent: Jul. 23, 2019

(54) ION MILLING SYSTEM

(71) Applicant: HITACHI HIGH-TECHNOLOGIES CORPORATION, Tokyo (JP)

(72) Inventors: Kengo Asai, Tokyo (JP); Toru Iwaya, Tokyo (JP); Hisayuki Takasu, Tokyo (JP); Hiroyasu Shichi, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/760,994

(22) PCT Filed: Sep. 25, 2015

(86) PCT No.: PCT/JP2015/077095
§ 371 (c)(1),
(2) Date: Mar. 16, 2018

(87) PCT Pub. No.: WO2017/051469
PCT Pub. Date: Mar. 30, 2017

(65) Prior Publication Data
US 2018/0286633 A1    Oct. 4, 2018

(51) Int. Cl.
*H01J 37/31* (2006.01)
*H01J 37/28* (2006.01)
(Continued)

(52) U.S. Cl.
CPC .............. *H01J 37/31* (2013.01); *H01J 37/08* (2013.01); *H01J 37/09* (2013.01); *H01J 37/20* (2013.01);
(Continued)

(58) Field of Classification Search
CPC .. H01J 37/31; H01J 37/08; H01J 37/09; H01J 37/20; H01J 37/28; H01J 37/305; H01J 2237/0262; H01J 2237/04732
(Continued)

(56) References Cited

U.S. PATENT DOCUMENTS 4,800,281 A   1/1989  Williamson
2003/0221781 A1*  12/2003  Yamaguchi ....... H01J 37/32009
                                                156/345.39
(Continued)

FOREIGN PATENT DOCUMENTS

JP   08-298092 A   11/1996
JP   2000-195460 A   7/2000
JP   2002-208374 A   7/2002
JP   2013-011540 A   1/2013
WO   2012/060416 A1   5/2012

OTHER PUBLICATIONS

International Search Report dated Dec. 1, 2015 of the PCT International Application No. PCT/JP2015/077095.
(Continued)

*Primary Examiner* — Nicole M Ippolito
(74) *Attorney, Agent, or Firm* — Volpe and Koenig, P.C.

(57) ABSTRACT

To provide an ion milling system that can suppress an orbital shift of an observation electron beam emitted from an electron microscope column, the ion milling system includes: a Penning discharge type ion gun 100 that includes a permanent magnet 114 and that generates ions for processing a sample; and a scanning electron microscope for observing the sample, in which a magnetic shield 172 for reducing a leakage magnetic field from the permanent magnet 114 to the electron microscope column is provided.

14 Claims, 10 Drawing Sheets

(51) Int. Cl.
  *H01J 37/20* (2006.01)
  *H01J 37/09* (2006.01)
  *H01J 37/08* (2006.01)
  *H01J 37/305* (2006.01)
(52) U.S. Cl.
  CPC ............ *H01J 37/28* (2013.01); *H01J 37/305* (2013.01); *H01J 2237/0262* (2013.01); *H01J 2237/04732* (2013.01)
(58) Field of Classification Search
  USPC ............ 250/306, 307, 309, 310, 311, 492.1, 250/492.2, 492.21, 492.22, 492.23, 492.3
  See application file for complete search history.

(56) References Cited

U.S. PATENT DOCUMENTS

| | | | |
|---|---|---|---|
| 2011/0266465 A1* | 11/2011 | Shichi | H01J 27/26 250/492.3 |
| 2013/0220806 A1 | 8/2013 | Iwaya et al. | |
| 2014/0124367 A1 | 5/2014 | Takeuchi et al. | |

OTHER PUBLICATIONS

Japanese Office Action dated Mar. 12, 2019 for the Japanese Patent Application No. 2017-541208.

\* cited by examiner

F I G . 1
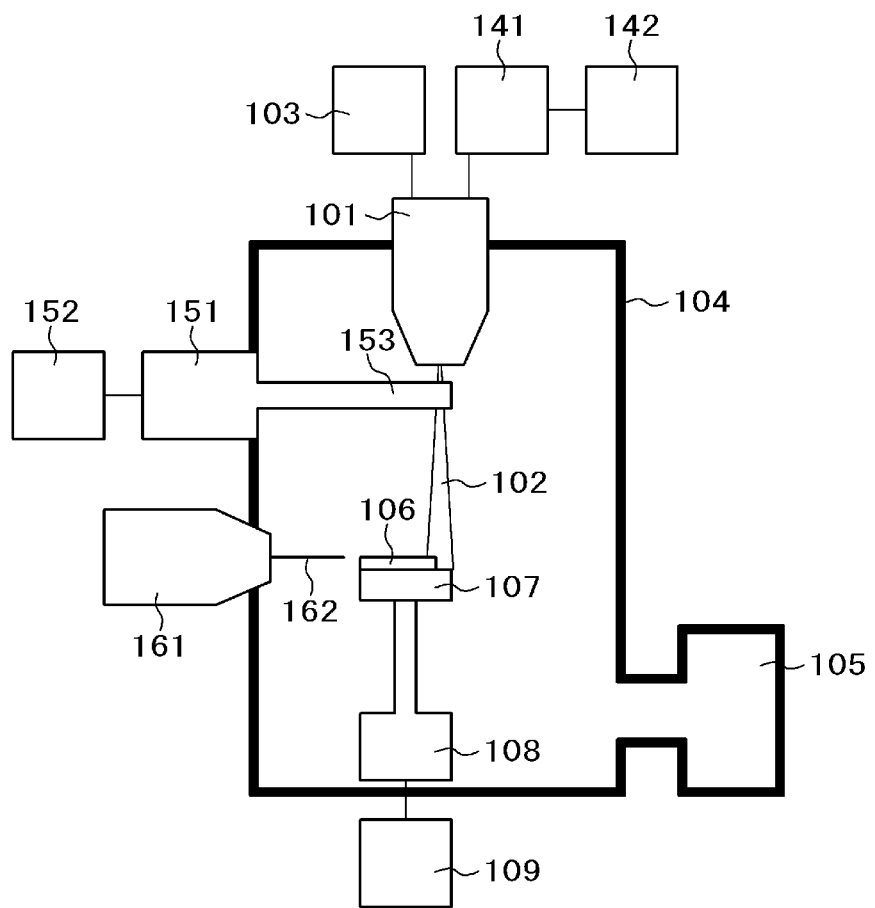

ION MILLING SYSTEM

TECHNICAL FIELD

The present invention relates to an ion milling system.

BACKGROUND ART

An ion milling system is a processing system that causes bombardment of a sample by accelerated ions and that cuts the sample using sputtering that the ions dislodge atoms and molecules. Furthermore, a mask that serves as an ion beam masking shield is placed on an upper surface of the sample to be processed, and a protruding portion of the sample from a mask end surface (exposed portion thereof that is not covered with the mask) is sputtered, whereby the sample can be processed to have a smooth cross-section. The ion milling system is employed for a target such as metal, glass, ceramics, an electronic component, or a composite material. For example, if the electronic component is a target, the ion milling system is used to create a cross-section sample for acquisition of a morphological image, a sample composition image, and a channeling image by a scanning electron microscope or for acquisition by X-ray analysis, crystal orientation analysis, or the like for use applications including evaluation of an internal structure, a cross-sectional area shape, and a film thickness and analysis of a crystalline state, a failure, and a foreign substance cross-section.

Demand is high for combination of the ion milling system with an electron microscope system for the purpose of improving usability, responding to demand of three-dimensional analysis, responding to demand of analysis of a material that cannot be exposed to the atmosphere, or the like. Patent Document 1 discloses an ion milling system in which an electron microscope is mounted as a technique for checking a progress of milling processing while a sample is being subjected to the milling processing by an ion beam. Patent Document 2 discloses a method of observing an internal structure of a sample by a scanning electron microscope while the sample is gradually subjected to ion milling processing starting with a surface of the sample, as a method of three-dimensionally analyzing the internal structure of the sample. Patent Document 3 discloses a method with using a scanning electron microscope provided with a sample preprocessing system in which anion gun is mounted, the method sequentially observing a structure of a sample in a depth direction from a surface of the sample by a scanning electron microscope while the sample is gradually subjected to ion polishing starting with the surface of the sample in the same vacuum as that in which the structure is observed.

PRIOR ART DOCUMENT

Patent Document

Patent Document 1: International Publication No. WO2012/060416
Patent Document 2: JP-2000-195460-A
Patent Document 3: JP-H08-298092-A

SUMMARY OF THE INVENTION

Problem to be Solved by the Invention

Mounting a scanning electron microscope (SEM) in an ion milling system is expected to bring the following advantages. Even if an observation target to be processed by the ion milling system is a foreign substance cross-section having a dimension, for example, equal to or smaller than 1 μm, alignment of a sample processing position can be easily performed. In addition, the cross-section during or after processing by the ion milling system can be observed by the SEM within the same system as that in which the processing is performed. The inventors, therefore, conducted a study about an ion milling system in which an SEM was mounted. A result of the study will be explained below.

The inventors conducted a study about an ion milling system that employs, as an ion gun, a Penning discharge type ion gun having a simple configuration and being small in size. The Penning discharge type ion gun is configured such that electrons emitted from cathodes make a turning motion by a magnetic field from a permanent magnet and strike against gas introduced into the ion gun, thereby causing ionization. The electrons make a reciprocating motion between electrodes at the same potential by disposing the cathodes on both ends of an anode; thus, it is possible to make an orbit of the electrons long and to improve ionization efficiency. Part of cations generated in an ionization chamber are passed through a cathode outlet hole, accelerated by an accelerating electrode, and emitted to outside from an accelerating electrode outlet hole. Improving a milling performance requires an increase in an amount of ions emitted from the ion gun. To address the challenge, high plasma density is essential, and it is necessary to ensure a long electron orbit by forming a magnetic field at a high magnetic flux density. Since the Penning discharge type ion gun is configured such that the permanent magnet is provided thereinside, a leakage magnetic field from the ion gun has an adverse influence on an electron beam during electron microscope observation. It was discovered that since an electron emitted from an electron microscope column takes on a property that an orbit thereof is curved even by a very weak magnetic field, the ion milling system had a problem that the electron beam from an electron microscope was largely curved.

The present invention has been achieved in light of these respects, and an object of the present invention is to provide an ion milling system that can suppress an orbital shift of an electron beam emitted from an electron microscope column.

Means for Solving the Problem

To attain the object, according to one embodiment, there is provided an ion milling system including: an ion gun that includes a permanent magnet and that generates ions for processing a sample; and a scanning electron microscope that observes the sample, in which the ion milling system includes a magnetic shield that reduces a leakage magnetic field from the permanent magnet.

Effect of the Invention

According to the present invention, it is possible to provide an ion milling system that can suppress an orbital shift of an electron beam emitted from an electron microscope column.

BRIEF DESCRIPTION OF THE DRAWINGS

FIG. 1 is an overall cross-sectional configuration diagram showing an example of an ion milling system (according to each embodiment of the present invention or in a case in which the ion milling system includes an ion gun without a magnetic shield).

MODES FOR CARRYING OUT THE INVENTION

Figure 2:
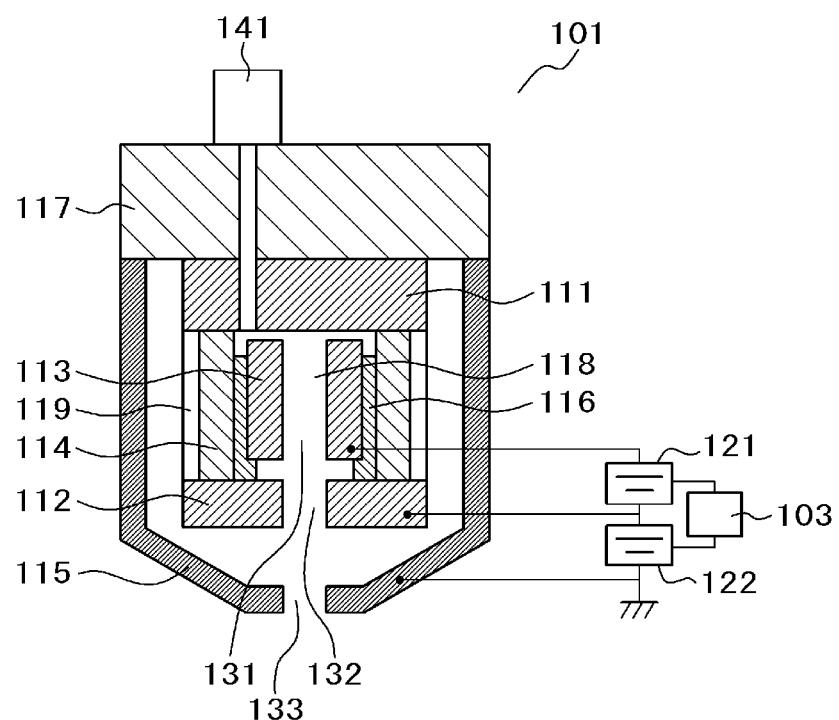
FIG. 2 is a cross-sectional configuration diagram for explaining the ion gun that does not include a magnetic shield structure.

After conducting a study about the problems, the inventors have decided to add a magnetic shield to a Penning discharge type ion gun. It is thereby possible to reduce a leakage magnetic field from a permanent magnet installed within the ion gun.

Specifically, the ion gun includes, for example, a gas supply mechanism that supplies gas into the ion gun; an anode which is disposed within the ion gun and to which a positive voltage is applied; two cathodes that generate a potential difference between the anode and the cathodes; a cathode ring and an insulator; and a permanent magnet, causes electrons emitted from the two cathodes to turn by the magnetic field, ionizes the gas by the turning electrons, and emits generated ions to outside of the ion gun by an accelerating electrode, in which the accelerating electrode is formed from a ferromagnetic material. This configuration thereby reduces the leakage magnetic field from the ion gun and sufficiently suppresses an orbital shift of an electron beam emitted from an electron microscope column.

In that case, the ferromagnetic material can be formed on a surface, on which the accelerating electrode is disposed, of an ion gun base.

Alternatively, an outer peripheral surface of the accelerating electrode formed from stainless steel and the surface, on which the accelerating electrode is disposed, of the ion gun base can be covered with the ferromagnetic material.

Alternatively, an inner peripheral surface of the accelerating electrode formed from stainless steel and the surface, on which the accelerating electrode is disposed, of the ion gun base can be covered with the ferromagnetic material.

Alternatively, a magnetic shield structure formed from a ferromagnetic material can be formed on an outer side of the ion gun, and the ferromagnetic material can be formed on the surface, on which the accelerating electrode is disposed, of the ion gun base.

Alternatively, the cathode ring can be formed from the ferromagnetic material.

In another alternative, the magnetic shield structure formed from the ferromagnetic material can be formed on an inner side of the accelerating electrode.

Preferably, the ferromagnetic material includes permalloy, pure iron, nickel, copper, molybdenum, and a material containing at least one type of permalloy, pure iron, nickel, copper, and molybdenum as a main component.

Adding the magnetic shield structure to the ion gun makes it possible to sufficiently reduce the leakage magnetic field from the permanent magnet disposed within the ion gun.

Furthermore, changing a structure of a magnetic shield electrode added to the ion gun makes it possible to control an axial magnetic field intensity within the ion gun. It is thereby possible to select an optimum axial magnetic field intensity for deriving an ion gun performance; thus, it is possible to obtain a far higher milling rate than that according to a conventional technique.

Preferred embodiments of the present invention will be explained hereinafter with reference to the drawings. It is noted that the same reference characters denote the same constituent elements.

First Embodiment

An ion milling system will be explained with reference to the drawings. FIG. 1 is an overall cross-sectional configuration diagram showing an example of the ion milling system. Constituent elements necessary to generate ions are disposed within a Penning discharge type ion gun 101, and an irradiation system for irradiating a sample 106 with an ion beam 102 is formed. Constituent elements necessary to generate an electron beam 162 are disposed within an electron microscope column 161, and an irradiation system for irradiating the sample 106 with the electron beam 162 is formed. A gas source 142 is connected to the ion gun 101 via a gas supply mechanism 141, and a gas flow rate controlled by the gas supply mechanism 141 is supplied into an ionization chamber of the ion gun 101. Irradiation of the ion beam 102 and an ion beam current of the ion beam 102 are controlled by an ion gun control section 103. The ion beam current of the ion beam 102 is measured by current measurement means 151. A current probe 153 also functions as an ion beam shutter and has a mechanism actuated by a current probe drive section 152. A vacuum chamber 104 is controlled to have an atmospheric pressure or to be in a vacuum by an evacuation system 105. The sample 106 is held on a sample stage 107 and the sample stage 107 is held by a sample stage drive section 108. The sample stage drive section 108 includes all of mechanism elements that can be drawn out of the vacuum chamber 104 when the vacuum chamber 104 is open to the atmosphere, and that can tilt the sample 106 at an arbitrary angle with respect to an optical axis of the ion beam 102. It is thereby possible to adjust the sample in desired directions during processing by the ion beam and observation by the electron beam. A sample stage drive control section 109 can control the sample stage drive section 108 in such a manner that the sample is tilted and swings longitudinally or horizontally, and can control a speed of the sample stage drive section 108.

FIG. 2 is a cross-sectional view showing configurations of the ion gun 101 that does not include a magnetic shield structure and relevant peripheral parts. The ion gun 101 is configured with the gas supply mechanism 141 that supplies gas into the ion gun, an anode 113, a first cathode 111 and a second cathode 112, a permanent magnet 114, an accelerating electrode 115, an insulator 116, and a cathode ring 119, and is secured to an ion gun base 117. The ion gun control section 103 is electrically connected to a discharge power source 121 and an accelerating power source 122, and controls a discharge voltage and an accelerating voltage. It is noted that reference character 118 denotes the ionization chamber, reference character 131 denotes an anode outlet hole, reference character 132 denotes a cathode outlet hole, and reference character 133 denotes an accelerating electrode outlet hole.

The first cathode 111 and the second cathode 112 are made of pure iron that is a ferromagnetic substance, and form, along with the permanent magnet 114 that is a magnetomotive force, a magnetic circuit. On the other hand, the accelerating electrode 115, the cathode ring 119, and the ion gun base 117 are made of stainless steel (SUS: Steel Special Use Stainless), and the accelerating electrode 115, the cathode ring 119, and the ion gun base 117 as well as the insulator 116 made of alumina and the anode 113 made of aluminum are not, therefore, included in the magnetic circuit.

Since the Penning discharge type ion gun as described above is configured such that the permanent magnet is provided inside, a leakage magnetic field from the ion gun has an influence on the electron beam during electron microscope observation. Even a slight electron beam orbital shift causes a problem particularly when a specific microscopic region is observed. Since an electron emitted from the electron microscope column takes on a property that an orbit thereof is curved by a very weak magnetic field, the electron beam is largely curved during conversion of the accelerating voltage or the like and an observation image that is being observed is largely shifted, accordingly in the ion milling system in which the electron microscope is mounted. To avoid this observation image shift, it is necessary to suppress the leakage magnetic field from the ion gun.

Figure 3:
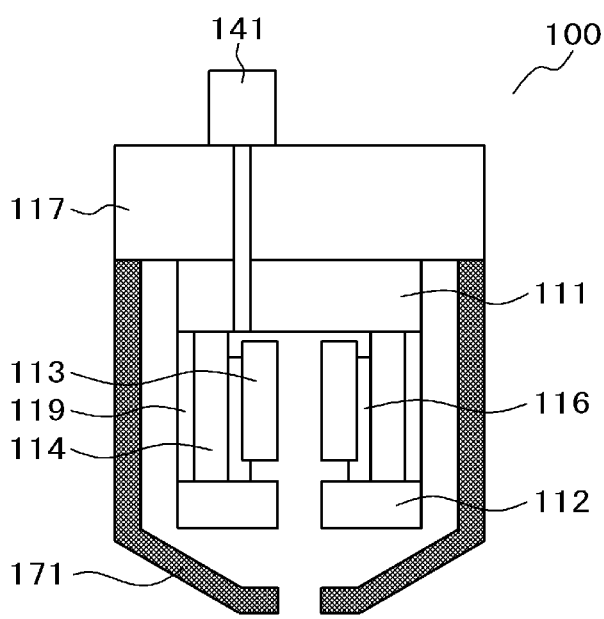
FIG. 3 is a cross-sectional configuration diagram showing an example (configurations 1 and 2) of an ion gun (including the magnetic shield structure) in the ion milling system according to a first embodiment of the present invention.

FIG. 3 is a cross-sectional configuration diagram showing an example of an ion gun (including a magnetic shield structure, hereinafter, referred to as "magnetic shield structure ion gun") in the ion milling system according to the present embodiment. The ion milling system according to the present embodiment has a configuration such that the ion gun 101 in FIG. 1 is replaced by a magnetic shield structure ion gun 100. The present Penning discharge type magnetic shield structure ion gun 100 includes the gas supply mechanism 141 that supplies gas into the ion gun, the anode 113 which is made of, for example, aluminum, which is disposed within the ion gun, and to which a positive voltage is applied, the first cathode 111 and the second cathode 112 which are made of, for example, pure iron and which generate a potential difference between the anode 113 and the first and second cathodes 111 and 112, the cathode ring 119 made of, for example, stainless steel and the insulator 116 made of, for example, alumina, and the permanent magnet 114 of, for example, neodymium. The present Penning discharge type magnetic shield structure ion gun 100 is characterized in that employing a magnetic shield 171 made of, for example, permalloy as the accelerating electrode makes it possible to obtain a sufficient shielding effect, reduce the leakage magnetic field from the magnetic shield structure ion gun 100, and sufficiently suppress the orbital shift of the electron beam 162 emitted from the electron microscope column 161 (configuration 1).

Alternatively, in the magnetic shield structure ion gun 100, forming the magnetic shield 171 made of, for example, pure iron in place of the magnetic shield made of permalloy as the accelerating electrode makes it possible to obtain a magnetic shielding effect, reduce the leakage magnetic field from the magnetic shield structure ion gun 100, and sufficiently suppress the orbital shift of the electron beam 162 emitted from the electron microscope column 161 (configuration 2).

Figure 4:
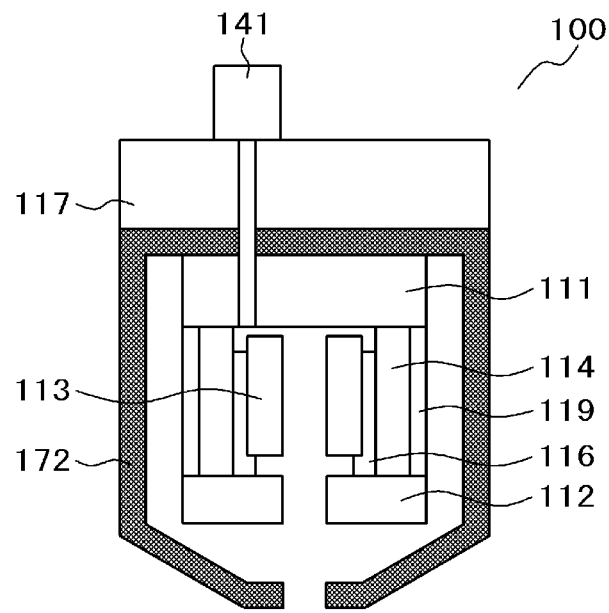
FIG. 4 is a cross-sectional configuration diagram showing another example (configuration 3) of the ion gun (including the magnetic shield structure) in the ion milling system according to the first embodiment of the present invention.

FIG. 4 is a cross-sectional configuration diagram showing another example of the magnetic shield structure ion gun in the ion milling system according to the present embodiment. The present Penning discharge type magnetic shield structure ion gun 100 is characterized in that forming the accelerating electrode from a magnetic shield 172 made of, for example, pure iron, and additionally forming the magnetic shield 172 made of, for example, pure iron on a surface, on a side of which the accelerating electrode is disposed, of the ion gun base 117 made of, for example, stainless steel make it possible to further reduce the leakage magnetic field from the magnetic shield structure ion gun 100 and sufficiently suppress the orbital shift of the electron beam 162 emitted from the electron microscope column 161 (configuration 3).

Figure 5:
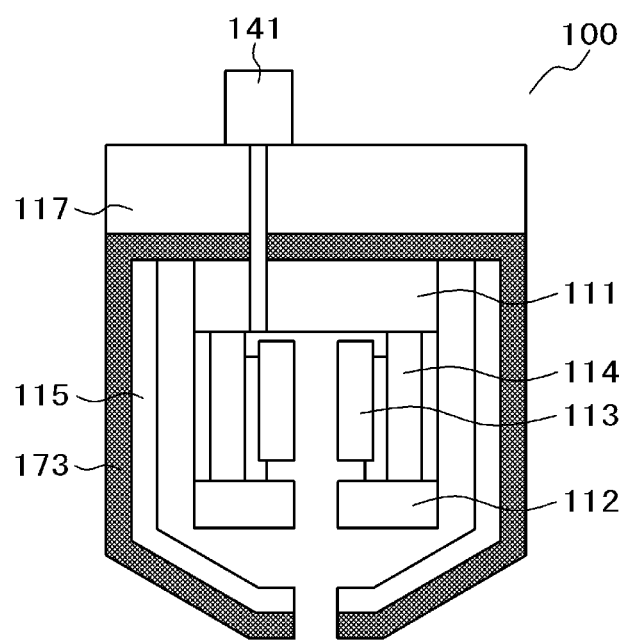
FIG. 5 is a cross-sectional configuration diagram showing another example (configuration 4) of the ion gun (including the magnetic shield structure) in the ion milling system according to the first embodiment of the present invention.

FIG. 5 is a cross-sectional configuration diagram showing yet another example of the magnetic shield structure ion gun in the ion milling system according to the present embodiment. The present Penning discharge type magnetic shield structure ion gun 100 is characterized in that covering an outer peripheral surface of the accelerating electrode 115 made of, for example, stainless steel and the surface, on aside of which the accelerating electrode 115 is disposed, of the ion gun base 117 made of, for example, stainless steel with a magnetic shield 173 made of, for example, pure iron makes it possible to reduce the leakage magnetic field from the magnetic shield structure ion gun 100 and sufficiently suppress the orbital shift of the electron beam 162 emitted from the electron microscope column 161 (configuration 4).

Figure 6:
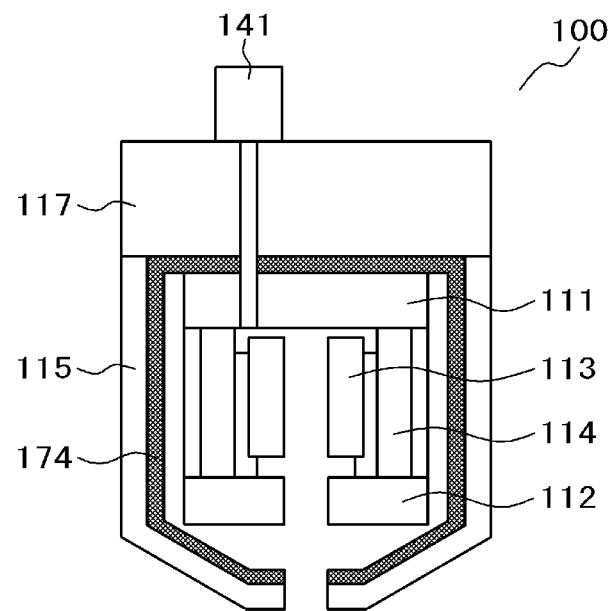
FIG. 6 is a cross-sectional configuration diagram showing another example (configuration 5) of the ion gun (including the magnetic shield structure) in the ion milling system according to the first embodiment of the present invention.

FIG. 6 is a cross-sectional configuration diagram showing still another example of the magnetic shield structure ion gun in the ion milling system according to the present embodiment. The present Penning discharge type magnetic shield structure ion gun 100 is characterized in that covering an inner peripheral surface of the accelerating electrode 115 made of, for example, stainless steel and the surface, on aside of which the accelerating electrode 115 is disposed, of the ion gun base 117 made of, for example, stainless steel with a magnetic shield 174 made of, for example, pure iron makes it possible to reduce the leakage magnetic field from the magnetic shield structure ion gun 100 and sufficiently suppress the orbital shift of the electron beam 162 emitted from the electron microscope column 161 (configuration 5).

Figure 7:
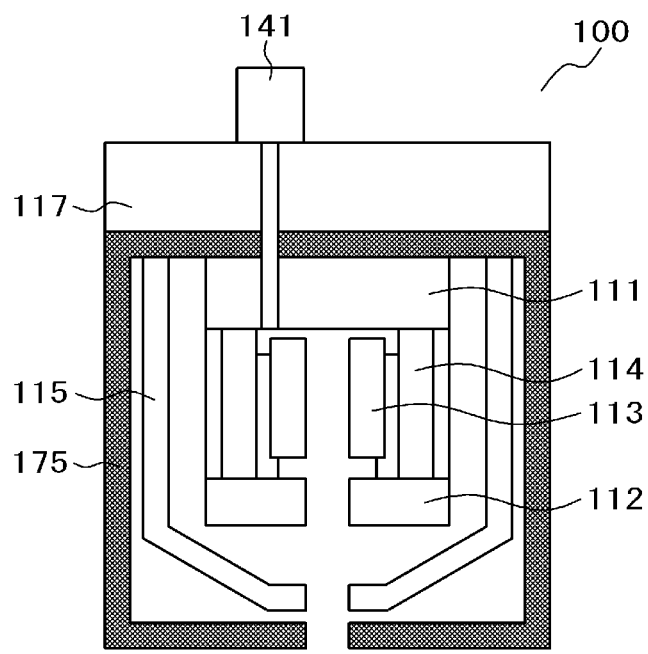
FIG. 7 is a cross-sectional configuration diagram showing another example (configuration 6) of the ion gun (including the magnetic shield structure) in the ion milling system according to the first embodiment of the present invention.

FIG. 7 is a cross-sectional configuration diagram showing yet another example of the magnetic shield structure ion gun in the ion milling system according to the present embodiment. The present Penning discharge type magnetic shield structure ion gun 100 is characterized in that forming a magnetic shield 175 made of, for example, a ferromagnetic material such as pure iron in an outermost portion of the ion gun and forming the magnetic shield 175 made of, for example, pure iron on the surface, on a side of which the accelerating electrode 115 made of, for example, stainless steel is disposed, of the ion gun base 117 made of, for example, stainless steel make it possible to reduce the leakage magnetic field from the magnetic shield structure ion gun 100 and sufficiently suppress the orbital shift of the electron beam 162 emitted from the electron microscope column 161 (configuration 6).

Figure 8:
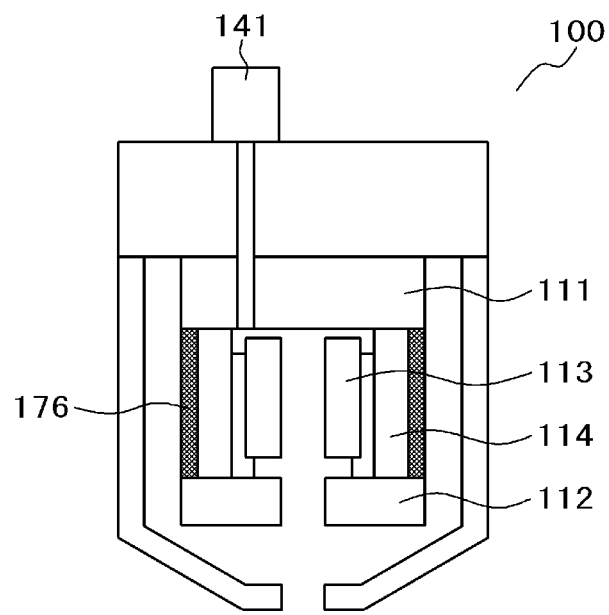
FIG. 8 is a cross-sectional configuration diagram showing another example (configuration 7) of the ion gun (including the magnetic shield structure) in the ion milling system according to the first embodiment of the present invention.

FIG. 8 is a cross-sectional configuration diagram showing still another example of the magnetic shield structure ion gun in the ion milling system according to the present embodiment. The present Penning discharge type magnetic shield structure ion gun 100 is characterized in that forming the cathode ring from a magnetic shield 176 made of, for example, pure iron makes it possible to reduce the leakage magnetic field from the magnetic shield structure ion gun 100 and sufficiently suppress the orbital shift of the electron beam 162 emitted from the electron microscope column 161 (configuration 7).

Figure 9:
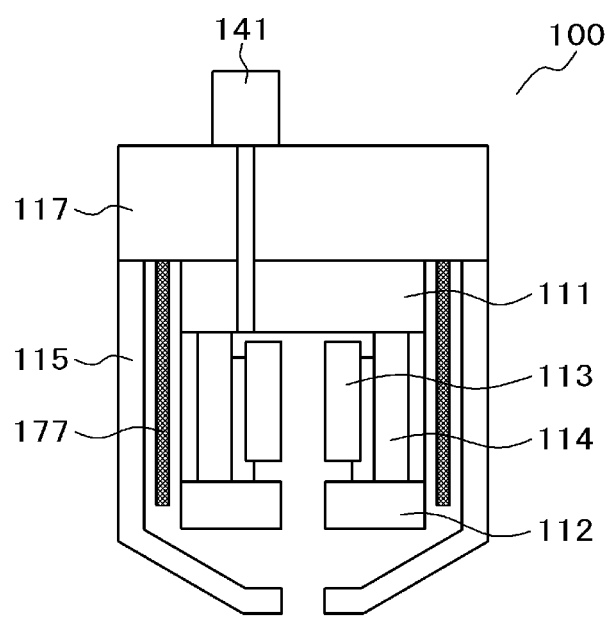
FIG. 9 is a cross-sectional configuration diagram showing another example (configuration 8) of the ion gun (including the magnetic shield structure) in the ion milling system according to the first embodiment of the present invention.

FIG. 9 is a cross-sectional configuration diagram showing yet another example of the magnetic shield structure ion gun in the ion milling system according to the present embodiment. The present Penning discharge type magnetic shield structure ion gun 100 is characterized in that forming a magnetic shield 177 made of, for example, pure iron on an inner side of the accelerating electrode 115 made of, for example, stainless steel makes it possible to reduce the leakage magnetic field from the magnetic shield structure ion gun 100 and sufficiently suppress the orbital shift of the electron beam 162 emitted from the electron microscope column 161 (configuration 8).

Figure 10:
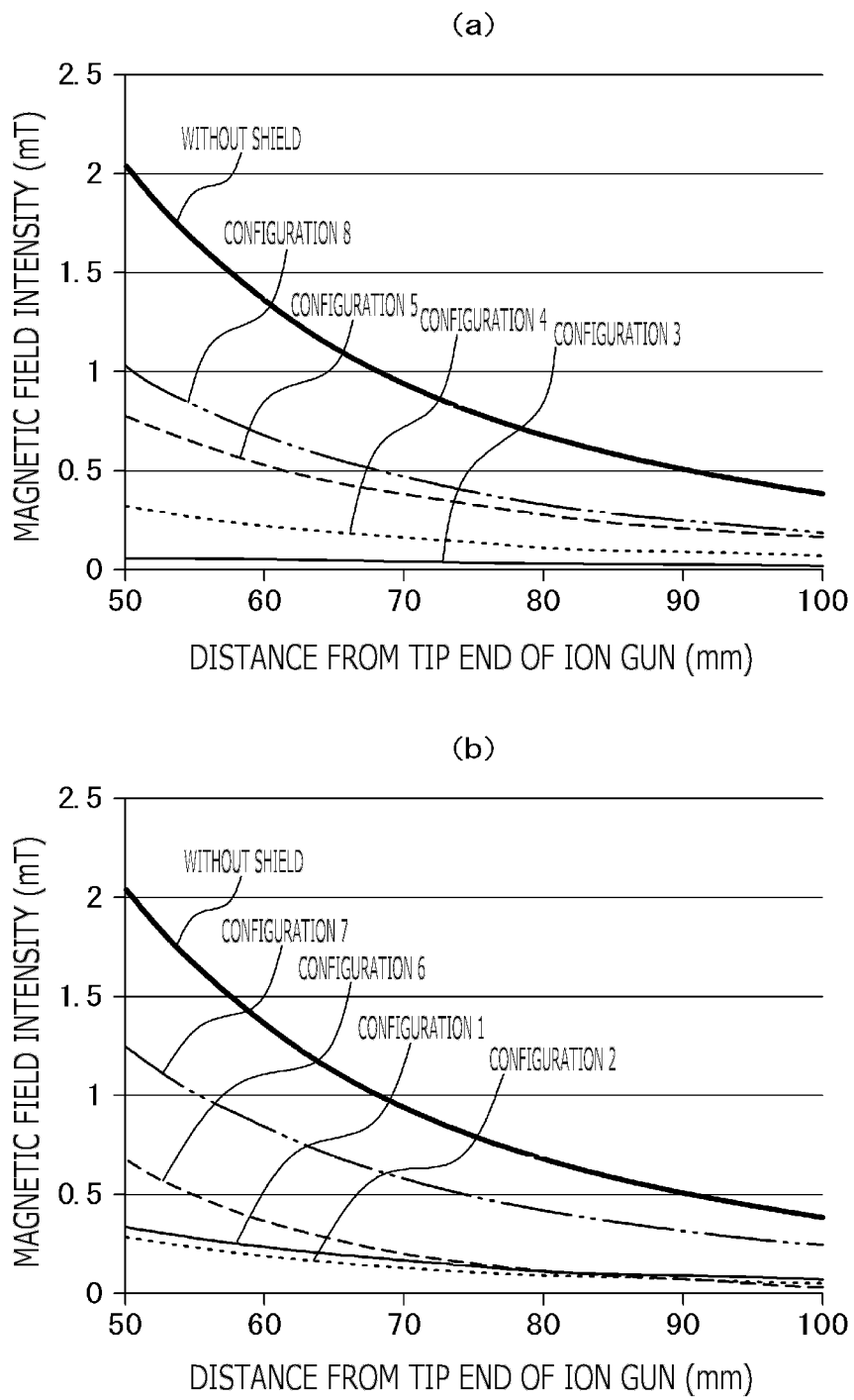
FIG. 10 shows an intensity of a magnetic field leaking from the ion gun, in which (a) shows intensities in cases of the configurations 3, 4, 5, and 8 and a case of the ion gun without the magnetic shield, and (b) shows intensities in cases of the configurations 1, 2, 6, and 7 and the case of the ion gun without the magnetic shield.

FIG. 10 shows an intensity of the magnetic field leaking from the magnetic shield structure ion gun 100 having each of the configurations in the ion milling system according to the present embodiment, in which (a) shows intensities in cases of the configurations 3, 4, 5, and 8 and a case of the ion gun without the magnetic shield, and (b) shows intensities in cases of the configurations 1, 2, 6, and 7 and the case of the ion gun without the magnetic shield. The intensities are obtained as a result of calculating leakage magnetic flux densities by a magnetic field simulator in a case of employing a neodymium magnet having a coercive force of 859 kA/m at a residual magnetic flux density in a range from 1250 to 1320 mT as the permanent magnet 114 mounted in the ion gun. In FIG. 10, a horizontal axis indicates a distance from a tip end of the ion gun and a horizontal axis indicates an intensity of the leakage magnetic field from the ion gun. For example, in a region 80 mm apart from the tip end of the ion gun, a leakage magnetic field intensity is 0.69 mT for the ion gun 101 to which the magnetic shield is not added. On the other hand, the leakage magnetic field intensity can be reduced to 0.12 mT for the magnetic shield structure ion gun with the configuration 1, 0.09 ml with the configuration 2, 0.03 mT with the configuration 3, 0.12 mT with the configuration 4, 0.27 ml with the configuration 5, 0.12 ml with the configuration 6, 0.42 mT with the configuration 7, and 0.34 mT with the configuration 8. It is understood that the leakage magnetic field intensity can be arbitrarily adjusted in a range from 4% to 60% of that for the ion gun to which the magnetic shield is not added by selecting a structure of the magnetic shield added to the ion gun.

As described so far, according to the present embodiment, it is possible to provide the ion milling system that includes the Penning discharge type ion gun and that can reduce the leakage magnetic field from the ion gun and sufficiently suppress the orbital shift of the electron beam emitted from the electron microscope column.

Figure 11:
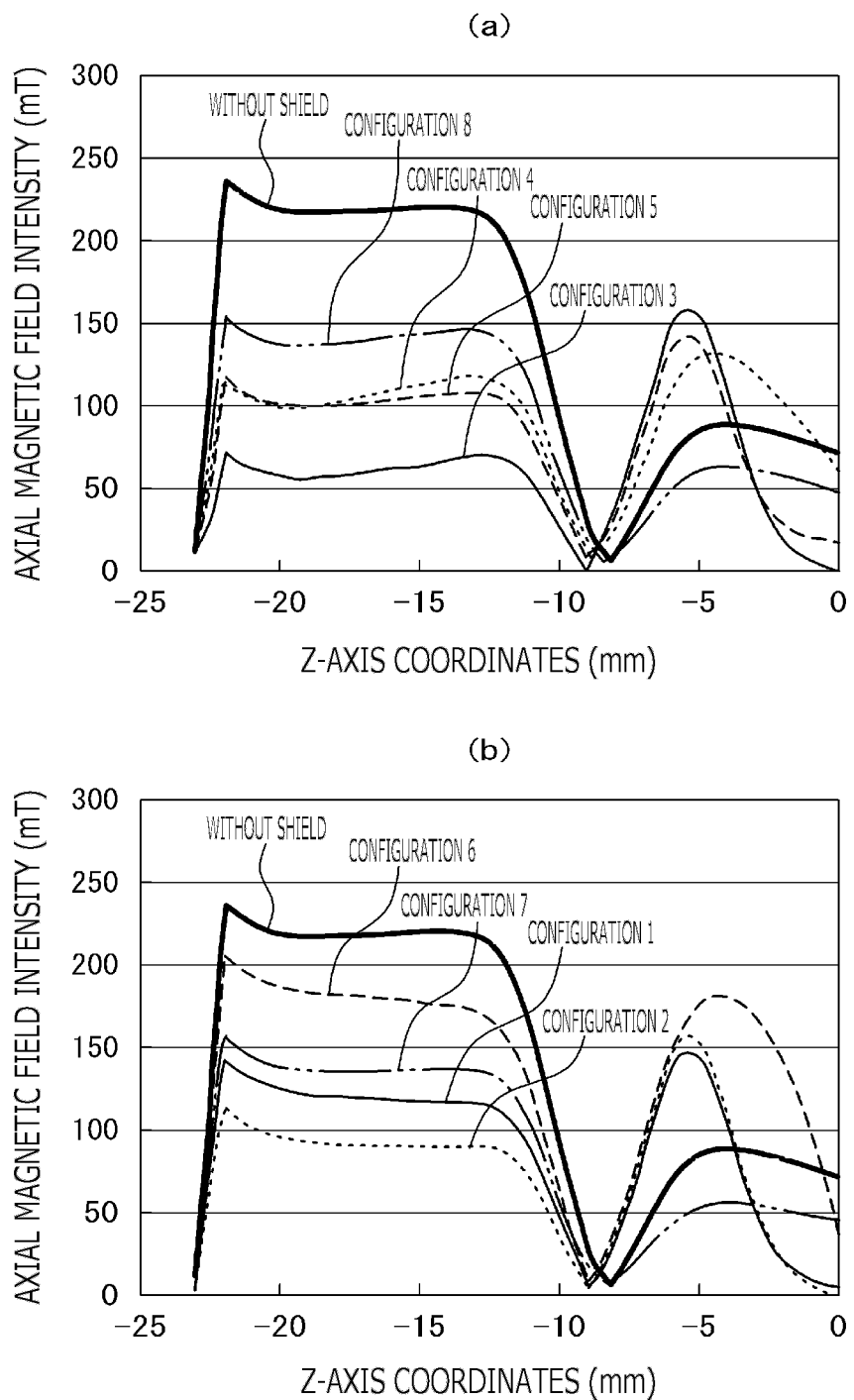
FIG. 11 shows an axial magnetic field intensity within the ion gun, in which (a) shows intensities in the cases of the configurations 3, 4, 5, and 8 and the case of the ion gun without the magnetic shield, and (b) shows intensities in the cases of the configurations 1, 2, 6, and 7 and the case of the ion gun without the magnetic shield.

FIG. 11 shows an axial magnetic field intensity within the ion gun, in which (a) shows intensities in the cases of the configurations 3, 4, 5, and 8 and the case of the ion gun without the magnetic shield, and (b) shows intensities in the cases of the configurations 1, 2, 6, and 7 and the case of the ion gun without the magnetic shield. The intensities are obtained as a result of calculating axial magnetic field intensities by the magnetic field simulator in the case of employing the neodymium magnet having the coercive force of 859 kA/m at the residual magnetic flux density in the range from 1250 to 1320 mT as the permanent magnet 114 mounted in the ion gun. In Z-axis coordinates indicated by a horizontal axis of FIG. 11, a position at which the magnet is disposed is in a range from Z=−22.5 mm to −10.5 mm. This region functions as a plasma generation chamber within the ion gun. The axial magnetic field intensity is about 220 mT for the ion gun 101 to which the magnetic shield is not added. On the other hand, the axial magnetic field intensity is about 120 mT for the magnetic shield structure ion gun with the configuration 1, about 90 mT with configuration 2, about 60 mT with the configuration 3, about 105 mT with the configuration 4, about 100 mT with the configuration 5, about 180 mT with the configuration 6, about 130 mT with the configuration 7, and about 140 mT with the configuration 8. It is understood that the axial magnetic field intensity within the magnetic shield structure ion gun 100 can be arbitrarily adjusted in a range from 27% to 82% of that for the ion gun to which the magnetic shield is not added by selecting the structure of the magnetic shield added to the ion gun.

Figure 12:
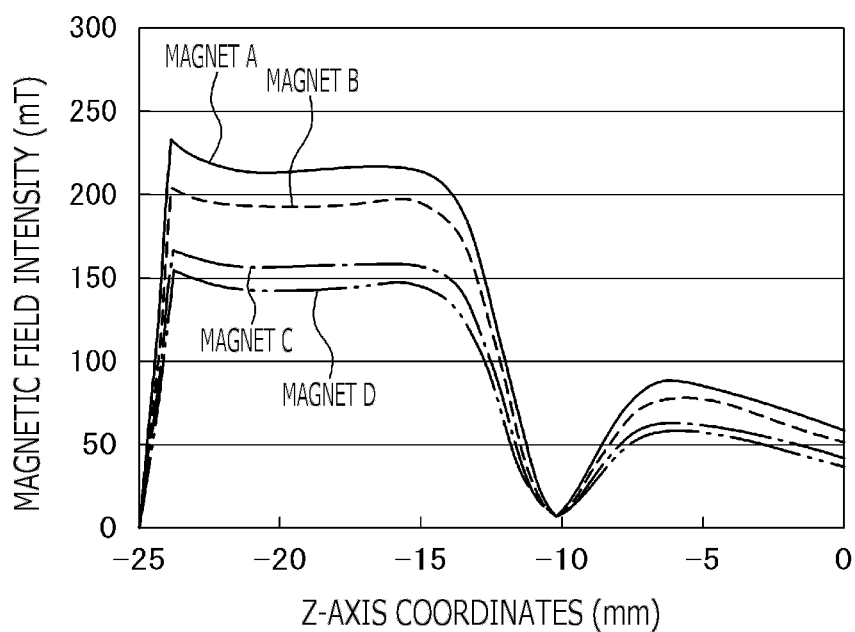
FIG. 12 shows axial magnetic field intensities within the ion gun without the magnetic shield (with mounted magnets having different characteristics used as parameters).

A result of conducting a study about a relationship between the axial magnetic field intensity and performances of the permanent magnet 114 will next be explained. Table 1 shows a list of performance figures of magnets used. FIG. 12 shows a result of calculating the magnetic field intensities (magnetic flux densities) on a central axis of the ion gun by the magnetic field simulator in cases of incorporating, as the permanent magnet 114, four types of magnets that are magnets A to D shown in Table 1 into the ion gun 101 to which the magnetic shield is not added. Numerical values shown in Table 1 are used as residual magnetic flux densities and coercive forces used in calculation. In the Z-axis coordinates indicated by a horizontal axis of FIG. 12, the position at which each magnet is disposed is in the range from Z=−22.5 mm to −10.5 mm. This region functions as the plasma generation chamber within the ion gun, and the axial magnetic field intensity is about 220 mT for the magnet A, about 195 mT for the magnet B, about 160 mT for the magnet C, and about 145 mT for the magnet D.

TABLE 1

|  | magnet A | magnet B | magnet C | magnet D |
|---|---|---|---|---|
| maximum energy product: (BH)max (kJ/m3) | 302-334 | 223-247 | 175-191 | 127-143 |
| residual magnetic flux density: Br (mT) | 1250-1320 | 1080-1150 | ≥950 | ≥850 |
| coercive force: HcB (kA/m) | ≥859 | ≥796 | ≥637 | ≥660 |
| axial magnetic flux density (mT) | 220 | 200 | 160 | 145 |

Figure 13:
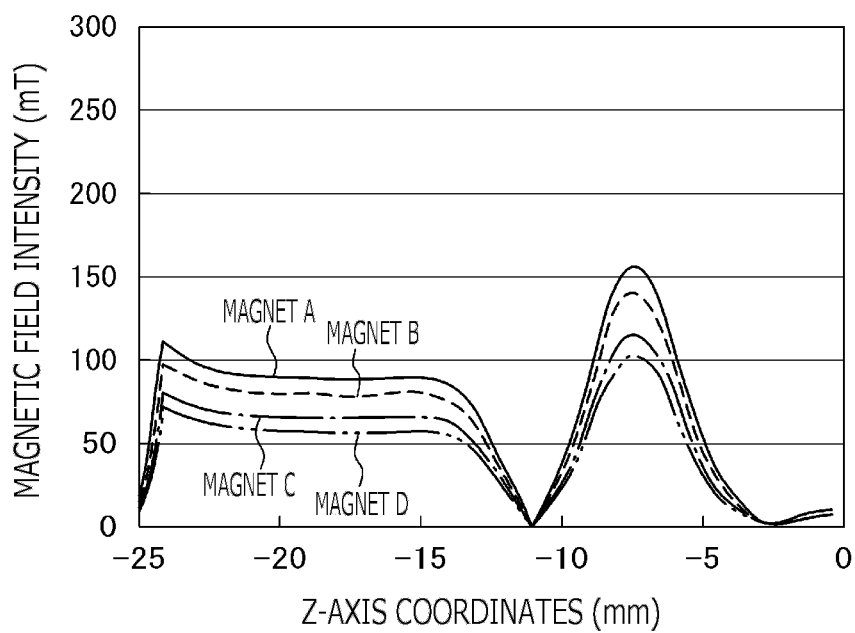
FIG. 13 shows axial magnetic field intensities within the ion gun that has the configuration 2 shown in FIG. 1 (with the mounted magnets having the different characteristics used as parameters).

On the other hand, FIG. 13 shows a result of calculating the magnetic field intensities (magnetic flux densities) on the central axis of the ion gun by the magnetic field simulator in cases of incorporating, as the permanent magnet 114, the four types of magnets that are the magnets A to D shown in Table 1 into the magnetic shield structure ion gun 100 shown in the configuration 2 as an example of the present embodiment. The numerical values shown in Table 1 are used as the residual magnetic flux densities and the coercive forces used in calculation. In Z-axis coordinates indicated by a horizontal axis of FIG. 13, the position at which the magnet is disposed is in the range from Z=−22.5 mm to −10.5 mm. This region functions as the plasma generation chamber within the ion gun, and the axial magnetic field intensity is about 90 mT for the magnet A, about 80 mT for the magnet B, about 65 mT for the magnet C, and about 60 mT for the magnet D. It is understood that the axial magnetic field intensity within the magnetic shield structure ion gun 100 is reduced by about 41% from that within the ion gun to which the magnetic shield is not added by employing the magnetic shield structure ion gun having the configuration 2, irrespectively of the type of the magnet. It is understood that the axial magnetic field intensity within the ion gun can be thereby arbitrarily adjusted in a wide range by selecting the type of the magnet and selecting the magnetic shield structure. Confining a combination between selection of the appropriate magnetic field intensity and the appropriate ionization chamber in relation to the selected ion gun configuration makes it possible to ideally increase an amount of ions emitted from the ion gun. That is, in this case, the magnetic shield configures a magnetic field control board that controls an axial magnetic field. It is thereby possible to control a processing rate in response to various use applications different in a material, a quality of the material, and the like of the sample to be processed. It is noted that this effect itself can be obtained without the electron microscope.

Figure 14:
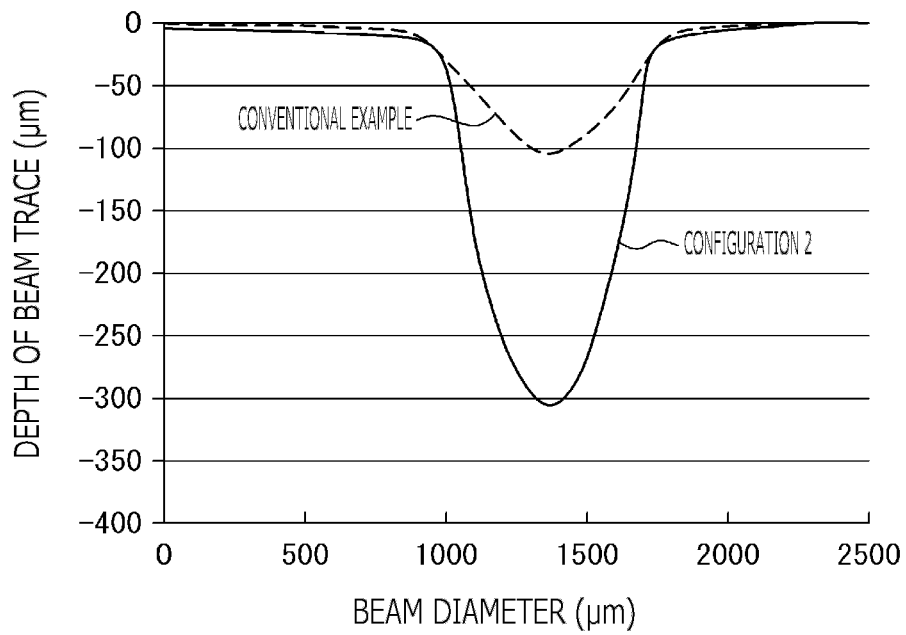
FIG. 14 shows an example of a beam profile for explaining effects of the present embodiment.

FIG. 14 shows an example of a beam profile for explaining effects of the present embodiment, and shows a spot depth in an ion gun configuration such that the magnet B of Table 1 is mounted in the magnetic shield structure ion gun 100 shown in the configuration 2 as an example of the present embodiment. A conventional example shown in FIG. 14 indicates an ion gun that is the ion gun 101 to which the magnetic shield is not added and into which the magnet B of Table 1 is incorporated as the permanent magnet 114. The ion gun configurations for both the present embodiment and the conventional example were such that that an anode inside diameter was 4 mm and a diameter of the anode outlet hole 131 was 4 mm. The accelerating voltage was 6 kV, the discharge voltage was 1.5 kV, and Ar gas at a flow rate of 0.07 cm³/minute was used as the gas introduced into the ion gun. Silicon was used as a material to be processed, and milling processing was conducted without a mask that acts as a masking shield for 1 hour. In this way, the beam profiles were obtained. A result shown in FIG. 14 indicates that a depth of a beam trace is about 100 μm for the conventional example, while the depth of the beam trace is about 300 μm, that is, a recorded milling rate is 300 μm/hour for the configuration 2, and that it is possible to obtain the milling rate about three times as high as that in the conventional example. Furthermore, a spot diameter of the ion beam is not reduced even in this case.

As explained so far, according to the present embodiment, it is possible to provide the ion milling system that can suppress the orbital shift of the electron beam emitted from the electron microscope column by adding the magnetic shield structure to the ion gun. It is also possible to control the axial magnetic field intensity within the ion gun to have an optimum value by adding the magnetic shield structure to the ion gun. Furthermore, it is thereby possible to provide the Penning discharge type ion milling system that can obtain the milling rate far higher than that according to the conventional technique or obtain the optimum value of the milling rate in response to the various materials or the like.

Second Embodiment

An ion milling system according to a second embodiment of the present invention will be explained. It is noted that matters that are described in the first embodiment but not described in the present embodiment are also applicable to the present embodiment unless there are exceptional circumstances.

Figure 15:
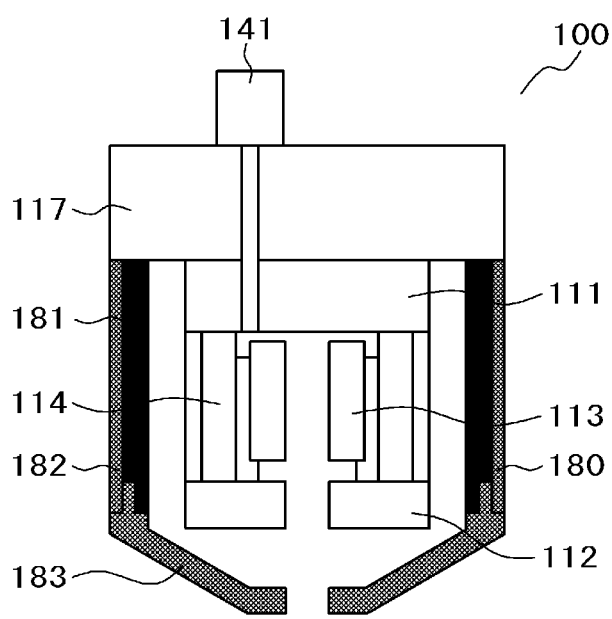
FIG. 15 is a cross-sectional configuration diagram showing an example of an ion gun (including an accelerating electrode guide member) in the ion milling system according to a second embodiment of the present invention.

FIG. 15 is a cross-sectional configuration diagram showing an example of an ion gun (including an accelerating electrode guide member) in the ion milling system according to the present embodiment, and a configuration is basically similar to the configuration 2 shown in the first embodiment. A difference between the configuration of the ion gun shown in FIG. 15 and the configuration 2 is that a magnetic shield type accelerating electrode 180 shown in FIG. 15 has a structure split into three parts and has an accelerating electrode guide member 181, a first accelerating electrode member 182, and a second accelerating electrode member 183.

The accelerating electrode guide member 181 is made of a material, for example, stainless steel, other than the ferromagnetic substance and secured to the ion gun base 117 by being screwed (or fitted) thereinto. The first accelerating electrode member 182 is formed from the ferromagnetic substance, for example, pure iron, installed by being fitted along an outer periphery of the accelerating electrode guide member 181, and secured by the magnetic field of the permanent magnet 114. The second accelerating electrode member 183 is formed from the ferromagnetic substance, for example, pure iron, and has a structure such that the second accelerating electrode member 183 is positioned with respect to the magnetic shield structure ion gun 100 by being fitted into grooves formed in tip end portions of the accelerating electrode guide member 181 and the first accelerating electrode member 182. Configuring the shield type accelerating electrode to have the structure split into the three parts can facilitate attaching the accelerating electrode guide member 181 formed from the material other than the ferromagnetic substance first without influence of the permanent magnet 114 and attaching the first and second accelerating electrode members that are the magnetic material next using this accelerating electrode guide member. In other words, the magnetic shield type accelerating electrode 180 that is the ferromagnetic material can be detached without interference of the permanent magnet 114 and maintainability can be ensured.

Figure 16:
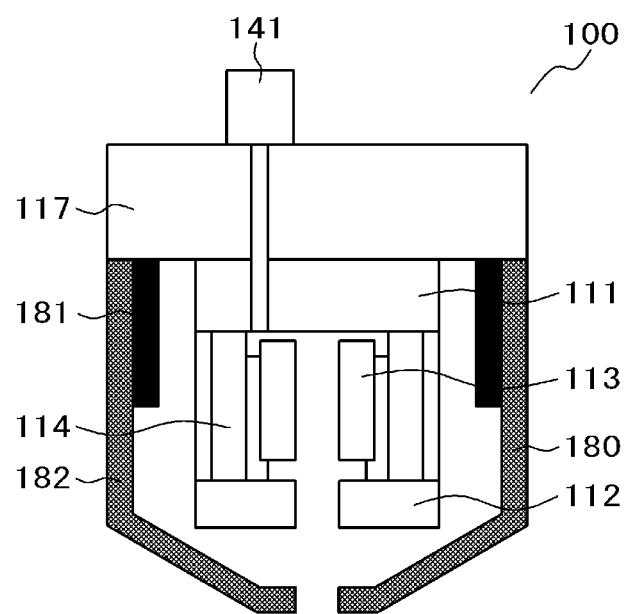
FIG. 16 is a cross-sectional configuration diagram showing another example of the ion gun (including the accelerating electrode guide member) in the ion milling system according to the second embodiment of the present invention.

FIG. 16 is a cross-sectional configuration diagram showing an example of an ion gun (including the accelerating electrode guide member) in the ion milling system according to the present embodiment, and a configuration is basically similar to the configuration 2 shown in the first embodiment. A difference between the configuration of the ion gun shown in FIG. 16 and the configuration 2 is that the magnetic shield type accelerating electrode 180 shown in FIG. 16 has a structure split into two parts and has the accelerating electrode guide member 181 and the accelerating electrode member 182.

The accelerating electrode guide member 181 is made of a material, for example, stainless steel other than the ferromagnetic substance and secured to the ion gun base 117 by being screwed thereinto. The accelerating electrode member 182 is formed from the ferromagnetic substance, for example, pure iron, and has a structure such that the accelerating electrode member 182 is installed by being fitted into the ion gun base 117 along the outer periphery of the accelerating electrode guide member 181 and is positioned with respect to the magnetic shield structure ion gun 100 by being secured to the ion gun base 117 by the magnetic field of the permanent magnet 114. Configuring the shield type accelerating electrode 180 to have the structure split into the two parts can facilitate attaching the accelerating electrode guide member 181 formed from the material other than the ferromagnetic substance first without influence of the permanent magnet 114 and attaching the accelerating electrode member 182 that is the magnetic material next using this accelerating electrode guide member 181. In other words, the magnetic shield type accelerating electrode 180 that is the ferromagnetic material can be detached without the interference of the permanent magnet 114 and the maintainability can be ensured. While the accelerating electrode guide member is provided because of use of the accelerating electrode as the magnetic shield in the present embodiment, similar effects can be basically obtained by providing a magnetic shield guide member formed from a material other than the ferromagnetic substance.

As explained so far, the present embodiment can exhibit similar effects to those of the first embodiment. Furthermore, providing the magnetic shield guide member such as the accelerating electrode guide member formed from the material other than the ferromagnetic substance makes it possible to facilitate attaching or detaching the ferromagnetic magnetic shield and ensure maintainability.

The present invention is not limited to the embodiments described above but encompasses various modifications. For example, the abovementioned embodiments have been explained in detail for explaining the present invention so that the present invention is easy to understand. The present invention is not always limited to the examples having all the configurations described so far. Furthermore, the configuration of the certain embodiment can be partially replaced by the configuration of the other embodiment or the configuration of the other embodiment can be added to the configuration of the certain embodiment. Moreover, for part of the configuration of each embodiment, additions, omissions, and substitutions of the other configurations can be made.

While the present invention has been explained in detail, the present invention includes the following aspects.

(1) An ion milling system including: an ion gun that includes a permanent magnet and that generates ions for processing a sample; and a scanning electron microscope that observes the sample, in which the ion milling system includes a magnetic shield that reduces a leakage magnetic field from the permanent magnet, and the magnetic shield configures a magnetic field control board that controls an axial magnetic field within the ion gun by changing a structure of the magnetic shield.

(2) An ion milling system including an ion gun that includes a permanent magnet and that generates ions for processing a sample, in which a magnetic field control board is disposed in such a manner that magnetic field control board surrounds an outer periphery of the permanent magnet, is formed from a ferromagnetic material, and controls an axial magnetic field intensity of the ion gun.

(3) The ion milling system according to (2), in which the ion gun includes an accelerating electrode that accelerates the ions; and an ion gun base that holds the permanent magnet and the accelerating electrode, and the magnetic field control board is also disposed on a surface, on a side of which the accelerating electrode is disposed, of the ion gun base.

(4) The ion milling system according to (2), in which the axial magnetic field intensity within the ion gun is controlled by changing a structure of the magnetic field control board.

DESCRIPTION OF REFERENCE CHARACTERS

100: Magnetic shield structure ion gun
101: Ion gun
102: Ion beam
103: Ion gun control section
104: Vacuum chamber
105: Evacuation system
106: Sample
107: Sample stage
108: Sample stage drive section
109: Sample stage drive control section
111: First cathode
112: Second cathode
113: Anode
114: Permanent magnet
115: Accelerating electrode
116: Insulator
117: Ion gun base
118: Ionization chamber
119: Cathode ring
121: Discharge power source
122: Accelerating power source
131: Anode outlet hole
132: Cathode outlet hole
133: Accelerating electrode outlet hole
141: Gas supply mechanism
142: Gas source
151: Current measurement means
152: Current probe drive section
153: Current probe
161: Electron microscope column
162: Electron beam
171, 172, 173, 174, 175, 176, 177: Magnetic shield
181: Magnetic shield type accelerating electrode 181: Accelerating electrode guide member
182, 183: Accelerating electrode member

The invention claimed is:

1. An ion milling system comprising:
an ion gun that includes a permanent magnet and that generates ions for processing a sample; and
a scanning electron microscope that observes the sample, wherein
the ion milling system includes a magnetic shield that reduces a leakage magnetic field from the permanent magnet,
the ion gun includes an accelerating electrode that accelerates the ions, and
the magnetic shield is the accelerating electrode configured with a ferromagnetic material.

2. The ion milling system according to claim 1, wherein
the ion gun includes an ion gun base that holds the permanent magnet and the accelerating electrode, and
a ferromagnetic material is disposed on a surface, on a side of which the accelerating electrode is disposed, of the ion gun base.

3. The ion milling system according to claim 1, wherein
the ion gun includes an ion gun base that holds the permanent magnet and the accelerating electrode, and
the magnetic shield is configured with the ferromagnetic material with which an outer peripheral surface of the accelerating electrode and a surface, on a side of which the accelerating electrode is disposed, of the ion gun base are covered.

4. The ion milling system according to claim 1, wherein
the ion gun includes an ion gun base that holds the permanent magnet and the accelerating electrode, and
the magnetic shield is configured with the ferromagnetic material with which an inner peripheral surface of the accelerating electrode and a surface, on a side of which the accelerating electrode is disposed, of the ion gun base are covered.

5. The ion milling system according to claim 1, wherein
the magnetic shield is configured with permalloy, pure iron, nickel, copper, molybdenum, and a material that contains at least one type of permalloy, pure iron, nickel, copper, and molybdenum as a main component.

6. The ion milling system according to claim 1, wherein
the ion gun includes an ion gun base that holds the permanent magnet and the accelerating electrode,
the accelerating electrode is a structure split into three parts that are an accelerating electrode guide member, a first accelerating electrode member, and a second accelerating electrode member,
the accelerating electrode guide member is formed from a material other than a ferromagnetic substance and secured to the ion gun base,
the first accelerating electrode member is formed from the ferromagnetic substance and installed on an outer side of the accelerating electrode guide member,
the second accelerating electrode member is formed from the ferromagnetic substance and installed by being positioned by the accelerating electrode guide member and the first accelerating electrode member, and
the first and second accelerating electrode members are secured by a magnetic field of the permanent magnet.

7. The ion milling system according to claim 1, wherein
the magnetic shield includes a magnetic shield guide member that is disposed to surround an outer side of the permanent magnet and that is formed from a material other than a ferromagnetic material; and a magnetic shield member that is disposed to surround an outer side of the magnetic shield guide member and that is formed from the ferromagnetic material.

8. An ion milling system comprising:
an ion gun that includes a permanent magnet and that generates ions for processing a sample; and
a scanning electron microscope that observes the sample, wherein
the ion milling system includes a magnetic shield that reduces a leakage magnetic field from the permanent magnet,
the ion gun includes an accelerating electrode that accelerates the ions; and
an ion gun base that holds the permanent magnet and the accelerating electrode, and
the magnetic shield is configured with a ferromagnetic material disposed on a surface, on a side of which the accelerating electrode is disposed, of the ion gun base, and a ferromagnetic material with which the accelerating electrode is covered and which is disposed apart from the accelerating electrode.

9. An ion milling system comprising:
an ion gun that includes a permanent magnet and that generates ions for processing a sample; and
a scanning electron microscope that observes the sample, wherein
the ion milling system includes a magnetic shield that reduces a leakage magnetic field from the permanent magnet,
the ion gun includes a cathode ring that is disposed on an outer peripheral surface of the permanent magnet, and
the magnetic shield is the cathode ring configured with a ferromagnetic material.

10. An ion milling system comprising:
an ion gun that includes a permanent magnet and that generates ions for processing a sample; and
a scanning electron microscope that observes the sample, wherein
the ion milling system includes a magnetic shield that reduces a leakage magnetic field from the permanent magnet,
the magnetic shield is configured with a ferromagnetic material that surrounds an outer periphery of the permanent magnet and that is disposed apart from the permanent magnet, and
the magnetic shield is on an inner side of an accelerating electrode.

11. An ion milling system comprising:
an ion gun that includes a permanent magnet and that generates ions for processing a sample; and
a scanning electron microscope that observes the sample, wherein
the ion milling system includes a magnetic shield that reduces a leakage magnetic field from the permanent magnet, and
the magnetic shield configures a magnetic field control board that controls an axial magnetic field within the ion gun by changing a structure of the magnetic shield.

12. An ion milling system comprising an ion gun that includes a permanent magnet and that generates ions for processing a sample, wherein
a magnetic field control board is disposed in such a manner that magnetic field control board surrounds an outer periphery of the permanent magnet, is formed from a ferromagnetic material, and controls an axial magnetic field intensity within the ion gun.

13. The ion milling system according to claim 12, wherein the ion gun includes an accelerating electrode that accelerates the ions; and an ion gun base that holds the permanent magnet and the accelerating electrode, and the magnetic field control board is also disposed on a surface, on a side of which the accelerating electrode is disposed, of the ion gun base.

14. The ion milling system according to claim 12, wherein the axial magnetic field intensity within the ion gun is controlled by changing a structure of the magnetic field control board.

* * * * *